United States Patent
Zhang et al.

(10) Patent No.: US 10,974,960 B1
(45) Date of Patent: Apr. 13, 2021

(54) METHOD FOR OBTAINING SEMICONDUCTING CARBON NANOTUBE

(71) Applicants: Tsinghua University, Beijing (CN); HON HAI PRECISION INDUSTRY CO., LTD., New Taipei (TW)

(72) Inventors: Ke Zhang, Beijing (CN); Yuan-Qi Wei, Shenzhen (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/910,373

(22) Filed: Jun. 24, 2020

(30) Foreign Application Priority Data

Jan. 15, 2020 (CN) .......................... 202010041960.8

(51) Int. Cl.
*B82B 3/00* (2006.01)
*H01L 21/02* (2006.01)
*B01J 21/18* (2006.01)

(52) U.S. Cl.
CPC ........... *B82B 3/0071* (2013.01); *B01J 21/185* (2013.01); *B82B 3/0061* (2013.01); *B82B 3/0076* (2013.01); *H01L 21/02606* (2013.01); *Y10S 977/742* (2013.01)

(58) Field of Classification Search
CPC ... B82B 3/0071; B82B 3/0076; B82B 3/0061; B01J 21/185; H01L 21/02606; Y10S 977/742
See application file for complete search history.

(56) References Cited

U.S. PATENT DOCUMENTS

| | | | | |
|---|---|---|---|---|
| 2007/0258880 A1* | 11/2007 | Murakoshi | ............. | B82Y 30/00 |
| | | | | 423/447.1 |
| 2007/0264185 A1* | 11/2007 | Campbell | ............. | B82Y 30/00 |
| | | | | 423/349 |
| 2014/0166545 A1* | 6/2014 | Lyding | ................ | B03C 1/0335 |
| | | | | 209/212 |

(Continued)

OTHER PUBLICATIONS

Wang et al. ("Selective Surface Charge Sign Reversal on Metallic Carbon Nanotubes for Facile Ultrahigh Purity Nanotube Sorting," ACS Nano, 10, pp. 3222-3232, 2016) (Year: 2016).*

(Continued)

*Primary Examiner* — Yasser A Abdelaziez
(74) *Attorney, Agent, or Firm* — ScienBiziP, P.C.

(57) ABSTRACT

A method for obtaining semiconducting carbon nanotubes is provided. An insulating substrate comprising hollow portions and non-hollow portions is provided. A plurality of electrodes is formed on a surface of the non-hollow portions. A plurality of carbon nanotubes is formed on a surface of the insulating substrate, and the carbon nanotubes stretches across the hollow portions. The insulating substrate, the plurality of electrodes, and the carbon nanotubes are placed into a cavity, and the cavity is evacuated. A voltage is applied between any two electrodes, and photos of carbon nanotubes suspended between the two electrodes are taken. In the photo, darker ones are the semiconducting carbon nanotubes, and brighter ones are metallic carbon nanotubes. Finally, the metallic carbon nanotubes are removed.

20 Claims, 8 Drawing Sheets

(56) References Cited

U.S. PATENT DOCUMENTS

2014/0199229 A1* 7/2014 Strano ................... B82Y 40/00
                                                      423/447.2
2014/0262972 A1* 9/2014 Adiga ...................... B41J 2/03
                                                      209/127.4

OTHER PUBLICATIONS

Yu et al. ("Sorting centimeter-long single-walled carbon nanotubes," Nature, Scientific Reports, pp. 1-8, 2016) (Year: 2016).*

Finally, Zhao et al. ("Selective sorting of metallic/semiconducting single-walled carbon nanotube arrays by igniter-assisted gas-phase etching," Materials Chemistry, 2, pp. 157-162, 2018) (Year: 2018).*

* cited by examiner providing an insulating substrate, wherein the insulating substrate defines a plurality of hollow portions and a plurality of non-hollow portions alternately distributed; and forming a plurality of electrodes on a surface of the plurality of non-hollow portions, wherein the plurality of electrodes is separated by the plurality of hollow portions; —S1 forming a plurality of carbon nanotubes on a surface of the insulating substrate, wherein the plurality of carbon nanotubes is parallel to and spaced from each other and in direct contact with the plurality of electrodes, the plurality of carbon nanotubes gets across the plurality of hollow portions, and portions of each of the plurality of carbon nanotubes located in the plurality of hollow portions are suspended; —S2 placing the insulating substrate, the plurality of electrodes and the plurality of carbon nanotubes into a cavity, and then evacuating the cavity; —S3 applying a voltage between any two electrodes of the plurality of electrodes; and taking a photo of carbon nanotubes suspended between the two electrodes with a camera, to obtain the photo of the carbon nanotubes suspended between the two electrodes, wherein in the photo, darker carbon nanotubes are the semiconducting carbon nanotubes, and brighter carbon nanotubes are metallic carbon nanotubes; —S4 removing the metallic carbon nanotubes to obtain the semiconducting carbon nanotubes —S5

FIG. 1

METHOD FOR OBTAINING SEMICONDUCTING CARBON NANOTUBE

CROSS-REFERENCE TO RELATED APPLICATIONS

This application claims all benefits accruing under 35 U.S.C. § 119 from China Patent Application No. 202010041960.8, filed on Jan. 15, 2020, in the China Intellectual Property Office, the contents of which are hereby incorporated by reference. The application is also related to co-pending applications entitled, "METHOD FOR OBTAINING METALLIC CARBON NANOTUBE", filed Ser. No. 16/910,378.

FIELD

The present disclosure relates to a method for obtaining semiconducting carbon nanotubes.

BACKGROUND

Single-walled carbon nanotubes are a kind of nanomaterial with great potential for research. Based on its nanoscale size and special structure, single-walled carbon nanotubes have good electrical properties, photoelectric properties, and semiconductor-type properties. Single-walled carbon nanotubes can be divided into two types: metallic type and semiconducting type. Semiconducting carbon nanotubes are an excellent semiconductor material, which is widely used in semiconductor devices. Therefore, it is very important to find a method for identifying and obtaining semiconducting carbon nanotubes.

Conventional methods for obtaining semiconducting carbon nanotubes usually use Raman spectroscopy or electrical measurement to identify semiconducting carbon nanotubes and then obtain them; however, this method is inefficient due to the complex operation. Scanning electron microscopy is more and more used to identify semiconducting carbon nanotubes because of its high discrimination efficiency. The conventional method for identifying semiconducting carbon nanotubes using the scanning electron microscope, carbon nanotubes are placed on a silicon substrate, an external voltage is applied under a normal pressure, and the semiconducting carbon nanotubes are distinguished by different brightness of the carbon nanotubes in the scanning electron microscope photos.

However, in the conventional method for identifying and obtaining semiconducting carbon nanotubes, the carbon nanotubes are in direct contact with the silicon substrate, and the silicon substrate absorbs a large amount of heat, so a large external voltage needs to be applied to identify the semiconducting carbon nanotubes, wasting resources. Moreover, the semiconducting carbon nanotubes need to be observed with the scanning electron microscope, and the cost is relatively high. Furthermore, carbon nanotubes are easily oxidized when applied a voltage under a normal pressure, and thus it is difficult to obtain pure semiconducting carbon nanotubes.

BRIEF DESCRIPTION OF THE DRAWINGS

Implementations of the present technology will now be described, by way of example only, with reference to the attached figures, wherein:

FIG. 1 is a flow diagram of one embodiment of a method for obtaining semiconducting carbon nanotubes.

DETAILED DESCRIPTION

Figure 2:
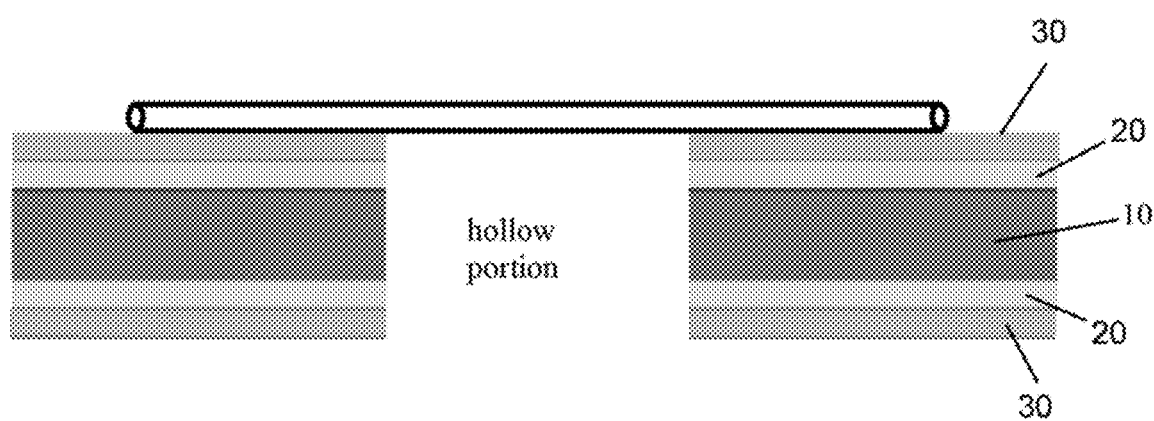
FIG. 2 is a schematic diagram of one embodiment of a partial cross section of an insulating substrate.

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean "at least one."

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts have been exaggerated to illustrate details and features of the present disclosure better.

Several definitions that apply throughout this disclosure will now be presented.

The term "substantially" is defined to be essentially conforming to the particular dimension, shape, or other feature which is described, such that the component need not be exactly or strictly conforming to such a feature. The term "comprise," when utilized, means "include, but not necessarily limited to"; it specifically indicates open-ended inclusion or membership in the so-described combination, group, series, and the like.

Referring to FIG. 1, one embodiment is described in relation to a method for obtaining semiconducting carbon nanotubes. The method for obtaining the semiconducting carbon nanotubes comprises steps of:

S1: providing an insulating substrate, wherein the insulating substrate defines a plurality of hollow portions and a plurality of non-hollow portions alternately distributed; and forming a plurality of electrodes on a surface of the plurality of non-hollow portions, wherein the plurality of electrodes is separated by the plurality of hollow portions;

S2: forming a plurality of carbon nanotubes on a surface of the insulating substrate, wherein the plurality of carbon nanotubes is parallel to and spaced from each other and in direct contact with the plurality of electrodes, the plurality of carbon nanotubes gets across the plurality of hollow portions, and portions of each of the plurality of carbon nanotubes located in the plurality of hollow portions are suspended;

S3: placing the insulating substrate, the plurality of electrodes and the plurality of carbon nanotubes into a cavity, and then evacuating the cavity;

S4: applying a voltage between any two electrodes of the plurality of electrodes; and taking a photo of carbon nanotubes suspended between the two electrodes with a camera, to obtain the photo of the carbon nanotubes suspended between the two electrodes, wherein in the photo, darker carbon nanotubes are the semiconducting carbon nanotubes, and brighter carbon nanotubes are metallic carbon nanotubes; and S5: removing the metallic carbon nanotubes to obtain the semiconducting carbon nanotubes.

In step S1, referring to FIG. 2, in one embodiment, the insulating substrate comprises a substrate body 10 and two insulating layers 20, two opposite surfaces of the substrate body 10 are defined as a first surface and a second surface, one of the two insulating layers 20 is located on the first surface, and another one of the two insulating layers 20 is located on the second surface. A material of the substrate body 10 can be a conductive material, an insulating material, or a semiconductor material. For example, the substrate body 10 can be a metal substrate, a conductive organic substrate, or a silicon substrate. A material of the two insulating layer 20 can be an oxide or a polymer material. In one embodiment, a thickness of the substrate body 10 ranges from about 300 micrometers to about 700 micrometers. In one embodiment, a thickness of each of the two insulating layer 20 ranges from about 50 nanometers to about 200 nanometers. In one embodiment, the substrate body 10 is a silicon substrate with a thickness of 500 micrometers, and the insulating layer 20 is a silicon dioxide layer with a thickness of 100 nanometers. Referring to FIG. 2, the silicon dioxide layer is disposed on each of the first surface and the second surface of the silicon substrate, and a mask layer 30 is disposed on each silicon dioxide layer 20, and the mask layer 30 is a $Si_3N_4$ layer with a thickness of 100 nanometers. The mask layer 30 is not an essential element and can be omitted. In another embodiment, the insulating layer 20 is only disposed on one surface of the substrate body 10.

Figure 3:
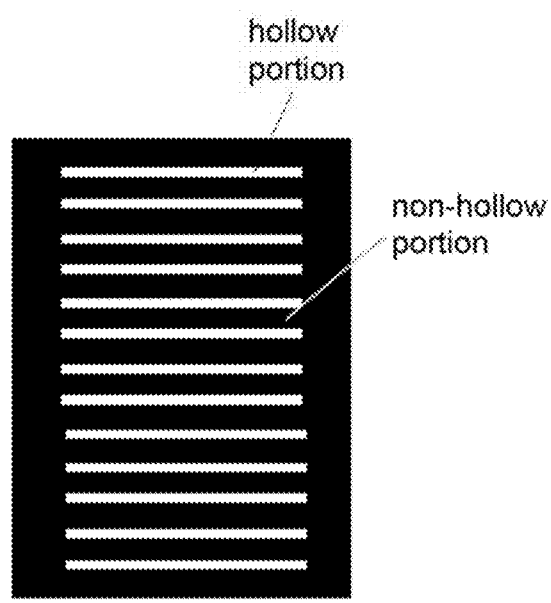
FIG. 3 is a top structural schematic diagram of one embodiment of the insulating substrate.

FIG. 3 is a top view of the insulating substrate. A method for making the insulating substrate comprises steps of: providing the substrate body 10 comprising a first surface and a second surface opposite to the first surface, and forming the insulating layer 20 on each of the first surface and the second surface; forming a mask layer 30 on a surface of each of the insulating layers 20, and each of the mask layers 30 defines some holes spaced from each other to make some portions of the insulating layer exposed; and immersing the substrate body 10 with the insulating layers 20 and the mask layers 30 in an etching solution, wherein, the substrate body 10 and the insulating layers 20 that are exposed from the holes of the mask layers 30 are etched away to obtain the plurality of hollow portions, the substrate body 10 and the insulating layers 20 covered with the mask layers 30 are the plurality of non-hollow portions. In another embodiment, the method for making the insulating substrate further comprises a step of removing the mask layers. In one embodiment, the method for making the insulating substrate comprises steps of: providing a silicon substrate comprising a first surface and a second surface opposite to the first surface, and forming a silicon dioxide layer on each of the first surface and the second surface of the silicon substrate; forming a $Si_3N_4$ layer on a surface of each of the silicon dioxide layers as a mask layer, and the $Si_3N_4$ layers defines some holes spaced from each other to make some portions of the silicon dioxide layers exposed; and immersing the silicon substrate with the silicon dioxide layers and the $Si_3N_4$ layers in an potassium hydroxide (KOH) solution, wherein, the silicon substrate and the silicon dioxide layers that are exposed from the holes of the $Si_3N_4$ layers are etched away to obtain the plurality of hollow portions, the silicon substrate and the silicon dioxide layers covered with the mask layers are the plurality of non-hollow portions. In some embodiment, the hollow portions are obtained directly by laser etching. When the hollow portions are obtained directly by laser etching, the insulating layer is not limited to be disposed on both the first surface and the second surface of the substrate body, the insulating layer can be disposed on only one surface of the substrate body.

Figure 4:
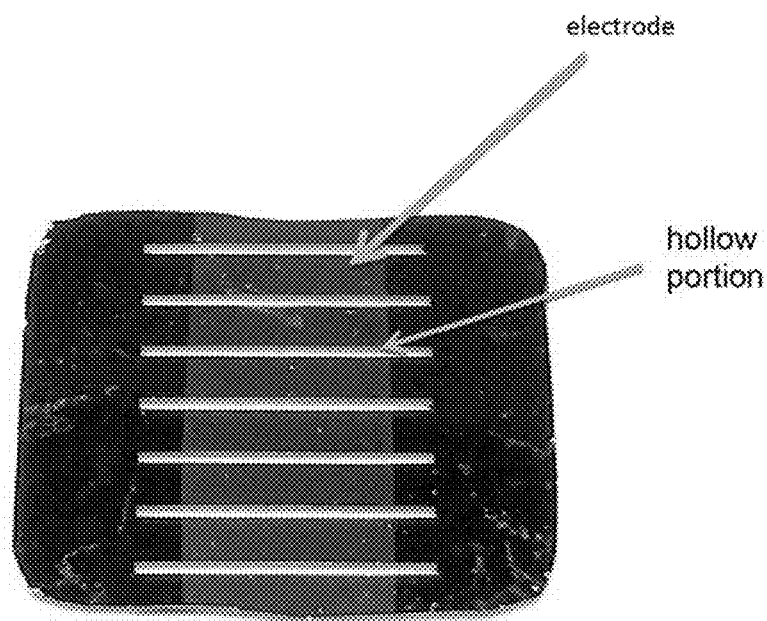
FIG. 4 is a schematic diagram of one embodiment of an overall structure formed by the insulating substrate and electrodes.

A shape and a size of each of the plurality of hollow portions can be designed according to actual needs. Referring to FIG. 4, in one embodiment, the shape of each of the plurality of hollow portions is a rectangle, and a width of the rectangle is 300 micrometers. In one embodiment, a total area of the plurality of hollow portions accounts for 20%-50% of an area of the insulating substrate. In one embodiment, the total area of the plurality of hollow portions accounts for 30% of the area of the insulating substrate.

A material of each of the plurality of electrodes can be metal, conductive polymer, conductive glue, antimony tin oxide (ATO), graphite electrode, or indium tin oxide (ITO). In one embodiment, each of the plurality of electrodes is a high temperature resistant electrode. In one embodiment, each of the plurality of electrodes is a molybdenum electrode, and one molybdenum electrode is located between any adjacent non-hollow portions.

In one embodiment, the plurality of electrodes is fixed on the plurality of non-hollow portions by a conductive adhesive; the conductive adhesive directly bonds the plurality of electrodes to the plurality of non-hollow portions. In one embodiment, an electrode paste is coated on the plurality of non-hollow portions of the insulating substrate, and then the electrode paste is cured to form the plurality of electrodes on the plurality of non-hollow portions. In another embodiment, the plurality of electrodes is formed on the plurality of non-hollow portions of the insulating substrate by a chemical deposition method or an electron beam evaporation method. A thickness of each of the plurality of electrodes is limited according to actual needs. In one embodiment, the thickness of each of the plurality of electrodes is larger than or equal to 20 nanometers. In one embodiment, a plurality of molybdenum electrodes is placed on the surface of the insulating substrate by electron beam evaporation, and a thickness of each of the plurality of molybdenum electrodes is 50 nanometers.

Figure 5:
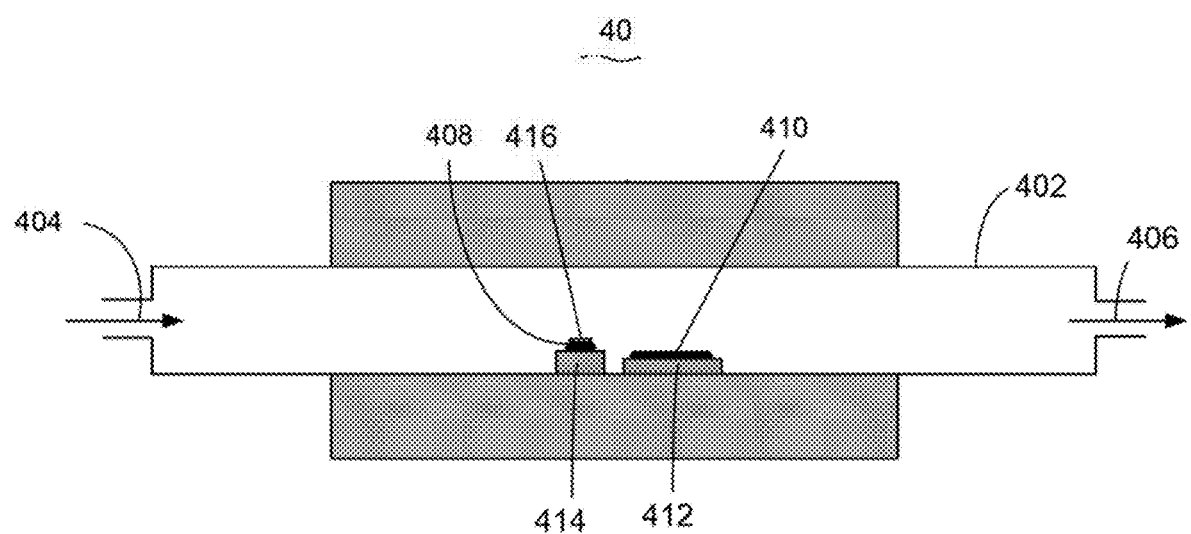
FIG. 5 is a structural schematic diagram of one embodiment of a growing device for carbon nanotubes.
Figure 6:
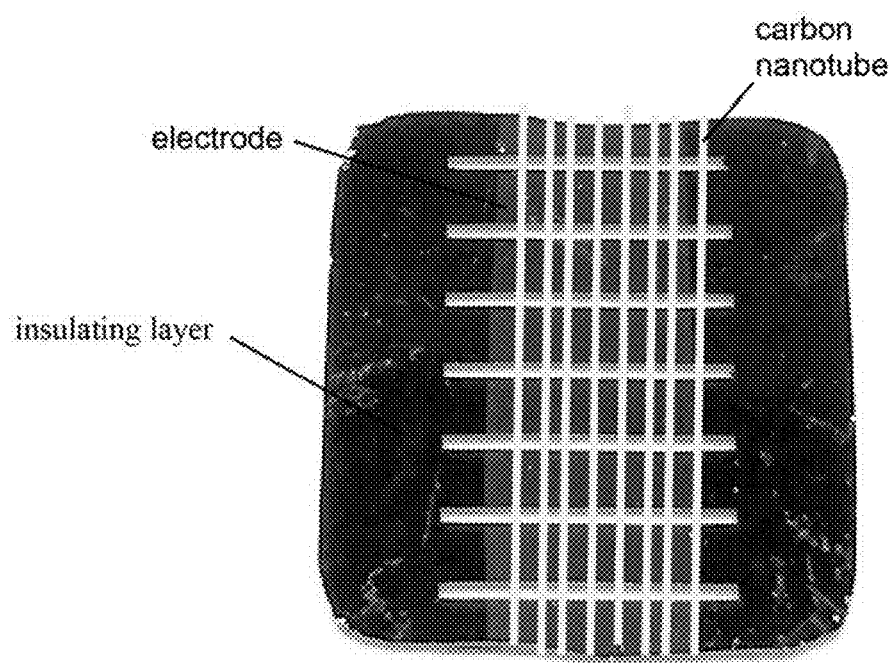
FIG. 6 is a schematic diagram of carbon nanotubes grown on a surface of the insulating substrate using a kite flying method.

In step S2, in one embodiment, referring to FIG. 5, a method of forming the plurality of carbon nanotubes on the surface of the insulating substrate is called a "kite flying method", and the method of forming the plurality of carbon nanotubes on the surface of the insulating substrate comprises steps. Firstly, a growing device 40 is provided, the growing device 40 comprises a reacting room 402 having a gas inlet 404 and a gas outlet 406, a growing substrate 408, a receiving substrate 410, a rotatable supporter 412 disposed in the reacting room 402, and a fixed supporter 414 disposed in the reacting room closer to the gas inlet 404 than the rotatable supporter 412, wherein a catalyst layer 416 is located on the growing substrate 408, the receiving substrate 410 is the insulating substrate with the plurality of electrodes. Secondly, the growing substrate 408 is placed on the fixed supporter 414, and the receiving substrate 410 is placed on the rotatable supporter 412. Thirdly, the plurality of carbon nanotubes is grown, wherein growing the plurality of carbon nanotubes comprises the steps of introducing a carbonaceous gas along a gas flow direction and stopping introducing the carbonaceous gas. Finally, the growing substrate 408 is changed, and more carbon nanotubes are grown to form the plurality of carbon nanotubes parallel to and spaced from each other on the insulating substrate. Examples of the kite flying method of forming the plurality of carbon nanotubes are taught by U.S. Pat. No. 8,163,340 to Wang et al. Due to the growing substrate and the receiving substrate in the kite flying method are not the same substrate, it avoids introducing the catalyst into the carbon nanotubes, so the plurality of carbon nanotubes is pure. The plurality of carbon nanotubes obtained by this method is arranged in parallel and orderly, a certain gap exists between adjacent carbon nanotubes, and there is substantially no entanglement between the plurality of carbon nanotubes. Therefore, ultra-long carbon nanotubes can be obtained, which is beneficial to identify and obtain semiconducting carbon nanotubes. FIG. 6 is a schematic diagram of the carbon nanotubes grown on the surface of the insulating substrate using the kite flying method.

In step S3, the cavity is evacuated by a vacuum pump. In one embodiment, a flow control valve is further provided between the cavity and the vacuum pump to adjust a flow conductance of the vacuum pump, thereby avoiding damage to the plurality of carbon nanotubes due to fast pumping. In one embodiment, an air pressure in the cavity is not higher than 0.1 Pa by evacuating the cavity.

In step S4, in one embodiment, the voltage between any two electrodes of the plurality of electrodes is ranged from 6V to 15V. In one embodiment, the voltage between any two electrodes of the plurality of electrodes is ranged from 8V to 12V. In one embodiment, the voltage between two adjacent electrodes is applied, and the applied voltage is 10V.

In the photo, the darker carbon nanotubes are the semiconducting carbon nanotubes, and the brighter carbon nanotubes are the metallic carbon nanotubes, and a brightness difference between the metallic carbon nanotubes and the semiconducting carbon nanotubes can be distinguished with the naked eyes. A reason for the brightness difference between the metallic carbon nanotubes and the semiconducting carbon nanotubes is the same as a principle of a tungsten filament lamp. Heat is generated when a current passes through the plurality of carbon nanotubes, and the plurality of carbon nanotubes gather heat constantly, which causes a temperature of the plurality of carbon nanotubes to rise continuously. When the temperature of the plurality of carbon nanotubes reaches 1700° C. or more, the plurality of carbon nanotubes is in an incandescent state and emits light. The higher the temperature of the carbon nanotubes, the brighter the light emitted from the carbon nanotubes. According to formula $Q=U^2/R$, the greater the resistance, the less heat can be generated, the lower the temperature of the carbon nanotubes, and the darker the light emitted from the carbon nanotubes. A resistance of the semiconducting carbon nanotubes is much greater than a resistance of the metallic carbon nanotubes. For example, when a voltage of 3V is applied, a current of the metallic carbon nanotubes is about 10 microamperes, and a current of the semiconducting carbon nanotubes is about 0.5 microamperes. When a same voltage is applied, a current difference between the metallic carbon nanotubes and the semiconducting carbon nanotubes is very large, which further explains that the resistance of the metallic carbon nanotubes and the resistance of the semiconducting carbon nanotubes are different greatly. Therefore, when the same voltage is applied, the brightness of the metallic carbon nanotubes and the brightness of the semiconducting carbon nanotubes are different greatly. The metallic carbon nanotubes are particularly bright, while the semiconducting carbon nanotubes are particularly dark, and the semiconducting carbon nanotubes can be easily distinguished with the naked eyes.

Figure 7:
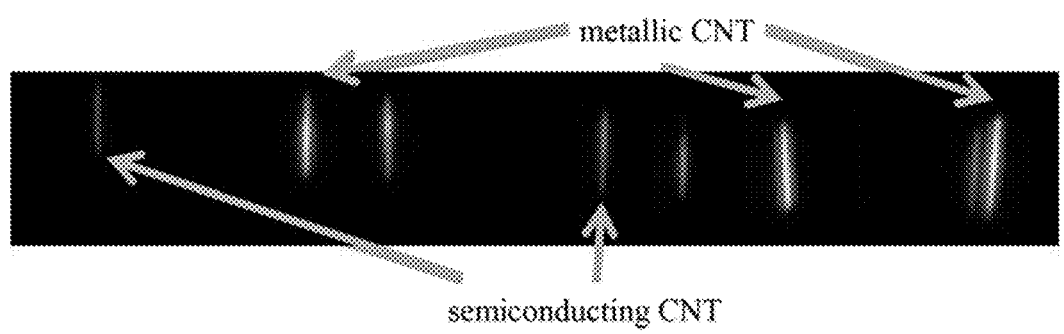
FIG. 7 shows a photo of carbon nanotubes suspended between two adjacent molybdenum electrodes, when a voltage is applied between the two adjacent molybdenum electrodes.

Referring to FIG. 7, when a voltage is applied between two adjacent molybdenum electrodes, there are two kinds of luminous situation of the plurality of carbon nanotubes suspended between the two adjacent molybdenum electrodes. One type of the carbon nanotubes emits light very brightly, another type of the carbon nanotubes emits light very dark, and the brightness difference between the bright carbon nanotubes and the dark carbon nanotubes is very obvious, which can be easily distinguished with the naked eyes. The darker ones are semiconducting carbon nanotubes, and the brighter ones are metallic carbon nanotubes.

In one embodiment, the camera is further connected to an image display, the photos taken by the camera are transferred to the image display, and the brightness of carbon nanotubes are observed on the image display. The semiconducting carbon nanotubes are distinguished according to the brightness difference, the brighter carbon nanotubes are metallic carbon nanotubes, and the darker carbon nanotubes are semiconducting carbon nanotubes.

Figure 8:
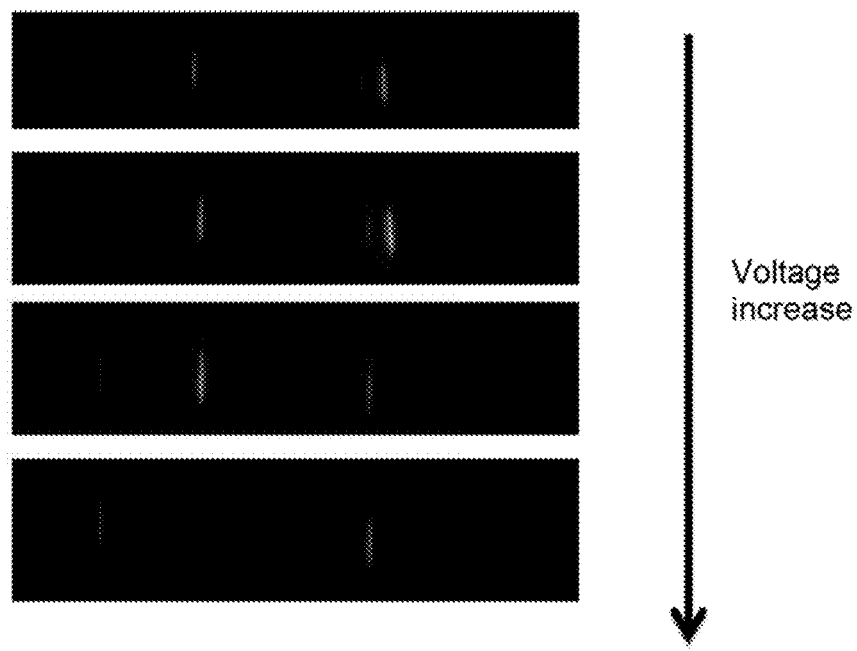
FIG. 8 is a photo of carbon nanotubes suspended between two molybdenum electrodes when an applied voltage between the two molybdenum electrodes gradually increases.

In step S5, in one embodiment, the darker carbon nanotubes are selected directly by a needle-like structure to obtain the semiconducting carbon nanotubes. Referring to FIG. 8, in one embodiment, the voltage between the two electrodes is gradually increased until all the brighter metallic carbon nanotubes are burned out, and the remaining darker carbon nanotubes are the semiconducting carbon nanotubes, thereby obtaining the semiconducting carbon nanotubes. In one embodiment, the needle-like structure is used to pierce all the brighter metallic carbon nanotubes, thereby obtaining the semiconducting carbon nanotubes.

When a single semiconducting carbon nanotube needs to be obtained, sulfur nanoparticles can be further deposited on the surface of the semiconducting carbon nanotube obtained in step S5, to make the semiconducting carbon nanotubes visible under an optical microscope; and then the single semiconducting carbon nanotube is selected under the optical microscope; finally, the sulfur nanoparticles are removed on the surface of the single semiconducting carbon nanotube.

The method for obtaining the semiconducting carbon nanotubes the present invention has advantages as follows:

The method for obtaining the semiconducting carbon nanotubes is performed in the vacuum, and the plurality of carbon nanotubes are suspended in the hollow portion, the heat accumulated by the plurality of carbon nanotubes suspended in the hollow portion is not absorbed by the substrate; therefore, the semiconducting carbon nanotubes can be identified by applying a small external voltage. Since the method for obtaining the semiconducting carbon nanotubes is performed in the vacuum, the plurality of carbon nanotubes is not easily oxidized, and pure semiconducting carbon nanotubes can be obtained. The plurality of carbon nanotubes is obtained by the kite flying method, the plurality of carbon nanotubes is free of impurities. The plurality of carbon nanotubes obtained by this method is arranged in parallel and orderly, a certain gap exists between the plurality of carbon nanotubes, and there is substantially no entanglement between the carbon nanotubes. Therefore, ultra-long carbon nanotubes can be obtained, which is beneficial to identify and obtain the semiconducting carbon nanotubes. The method for obtaining the semiconducting carbon nanotubes can distinguish the semiconducting carbon nanotubes by an ordinary camera; as such a cost of the method for obtaining the semiconducting carbon nanotubes is lower than that of using scanning electron microscope. The method for identifying and obtaining the semiconducting carbon nanotubes is simple to operate, and the equipment of the method is easy to build.

It is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

Depending on the embodiment, certain of the steps of a method described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. A method for obtaining semiconducting carbon nanotubes, the method comprising:
    S1: providing an insulating substrate, wherein the insulating substrate defines a plurality of hollow portions and a plurality of non-hollow portions alternately distributed; and forming a plurality of electrodes on a surface of the plurality of non-hollow portions, wherein the plurality of electrodes is separated by the plurality of hollow portions;
    S2: forming a plurality of carbon nanotubes on a surface of the insulating substrate, wherein the plurality of carbon nanotubes is parallel to and spaced from each other and in direct contact with the plurality of electrodes, the plurality of carbon nanotubes gets across the plurality of hollow portions, and a portion of each of the plurality of carbon nanotubes located in the hollow portion is suspended;
    S3: placing the insulating substrate, the plurality of electrodes, and the plurality of carbon nanotubes into a cavity, and then evacuating the cavity;
    S4: applying a voltage via any two electrodes of the plurality of electrodes; and taking a photo of carbon nanotubes suspended between the two electrodes with a camera, to obtain the photo of the carbon nanotubes suspended between the two electrodes, wherein in the photo, darker carbon nanotubes are the semiconducting carbon nanotubes, and brighter carbon nanotubes are metallic carbon nanotubes; and
    S5: removing the metallic carbon nanotubes to obtain the semiconducting carbon nanotubes.

2. The method of claim 1, wherein the insulating substrate comprises a substrate body and an insulating layer located on the substrate body.

3. The method of claim 2, wherein the substrate body is a silicon substrate, and the insulating layer is a silicon dioxide layer.

4. The method of claim 2, wherein a thickness of the substrate body ranges from 300 micrometers to 700 micrometers.

5. The method of claim 2, wherein a thickness of the insulating layer ranges from 50 nanometers to 200 nanometers.

6. The method of claim 1, wherein a method for making the insulating substrate comprises: providing a substrate body comprising a first surface and a second surface opposite to the first surface, and forming an insulating layer on each of the first surface and the second surface; forming a mask layer on a surface of each of the insulating layers, wherein the mask layer defines some holes spaced from each other to make some portions of the insulating layer exposed; and immersing the substrate body with the insulating layer and the mask layer in an etching solution, wherein, the substrate body and the insulating layer that are exposed from the holes of the mask layer are etched away to obtain the plurality of hollow portions, and the substrate body and the insulating layer covered with the mask layer are the plurality of non-hollow portions.

7. The method of claim 1, wherein a method for making the insulating substrate comprises: providing a silicon substrate comprising a first surface and a second surface opposite to the first surface, and forming a silicon dioxide layer on each of the first surface and the second surface; forming a $Si_3N_4$ layer on a surface of each of the silicon dioxide layers as a mask layer, wherein the $Si_3N_4$ layer comprises some holes spaced from each other to make some portions of the silicon dioxide layer exposed; and immersing the silicon substrate with the silicon dioxide layer and the $Si_3N_4$ layer in an potassium hydroxide solution, wherein, the silicon substrate and the silicon dioxide layer that are exposed from the holes of the $Si_3N_4$ layer are etched away to obtain the plurality of hollow portions, and the silicon substrate and the silicon dioxide layer covered with the $Si_3N_4$ layer are the plurality of non-hollow portions.

8. The method of claim 1, wherein a total area of the plurality of hollow portions accounts for 20%-50% of an area of the insulating substrate.

9. The method of claim 1, wherein each of the plurality of electrodes is a molybdenum electrode.

10. The method of claim 1, wherein a method of forming the plurality of carbon nanotubes on the surface of the insulating substrate comprises:
    providing a growing device, the growing device comprising a reacting room having a gas inlet and a gas outlet, a growing substrate, a receiving substrate, a rotatable supporter disposed in the reacting room, and a fixed supporter disposed in the reacting room closer to the gas inlet than the rotatable supporter, wherein a catalyst layer is located on the growing substrate, the receiving substrate is the insulating substrate with the plurality of electrodes;
    placing the growing substrate on the fixed supporter, and placing the receiving substrate on the rotatable supporter;
    growing the plurality of carbon nanotubes, wherein growing the plurality of carbon nanotubes comprises introducing a carbonaceous gas along a gas flow direction and stopping introducing the carbonaceous gas; and
    changing the growing substrate, and growing more carbon nanotubes to form the plurality of carbon nanotubes parallel to and spaced from each other on the insulating substrate.

11. The method of claim 1, wherein in S4, the voltage between the any two electrodes of the plurality of electrodes ranges from 6V to 15V.

12. The method of claim 1, wherein in S4, applying the voltage between adjacent electrodes, and an applied voltage is 10V.

13. The method of claim 1, wherein the camera is further connected to an image display, the photo of the carbon nanotubes suspended between the two electrodes taken by the camera is transferred to the image display, and brightness of the carbon nanotubes suspended between the two electrodes is observed on the image display.

14. The method of claim 1, wherein in S5, the darker carbon nanotubes are selected directly by a needle-like structure to obtain the semiconducting carbon nanotubes.

15. The method of claim 1, wherein in S5, the voltage between the two electrodes is gradually increased until all the brighter carbon nanotubes are burned out, and the remaining darker carbon nanotubes are the semiconducting carbon nanotubes.

16. The method of claim 1, wherein in S5, a needle-like structure is used to pierce all the brighter carbon nanotubes, to obtain the semiconducting carbon nanotubes.

17. The method of claim 1, further comprising selecting a single semiconducting carbon nanotube after S5, wherein the selecting the single semiconducting carbon nanotube comprises: depositing sulfur nanoparticles on surfaces of the semiconducting carbon nanotubes obtained in S5, to make the semiconducting carbon nanotubes visible under an optical microscope; selecting the single semiconducting carbon nanotube under the optical microscope; and removing the sulfur nanoparticles on the surface of the single semiconducting carbon nanotube.

18. A method for identifying semiconducting carbon nanotubes, the method comprising:
providing an insulating substrate, wherein the insulating substrate defines a plurality of hollow portions and a plurality of non-hollow portions alternately distributed; and forming a plurality of electrodes on a surface of the plurality of non-hollow portions, wherein the plurality of electrodes is separated by the plurality of hollow portions;
forming a plurality of carbon nanotubes on a surface of the insulating substrate, wherein the plurality of carbon nanotubes is parallel to and spaced from each other and in direct contact with the plurality of electrodes, the plurality of carbon nanotubes gets across the plurality of hollow portions, and a portion of each of the plurality of carbon nanotubes located in the hollow portion is suspended;
placing the insulating substrate, the plurality of electrodes, and the plurality of carbon nanotubes into a cavity, and then evacuating the cavity; and
applying a voltage via any two electrodes of the plurality of electrodes; and taking a photo of carbon nanotubes suspended between the two electrodes with a camera, to obtain the photo of the carbon nanotubes suspended between the two electrodes, wherein in the photo, darker carbon nanotubes are the semiconducting carbon nanotubes, and brighter carbon nanotubes are metallic carbon nanotubes.

19. The method of claim 18, wherein a method for making the insulating substrate comprises: providing a substrate body comprising a first surface and a second surface opposite to the first surface, and forming an insulating layer on each of the first surface and the second surface; forming a mask layer on a surface of each of the insulating layers, wherein the mask layer defines some holes spaced from each other to make some portions of the insulating layer exposed; and immersing the substrate body with the insulating layer and the mask layer in an etching solution, wherein, the substrate body and the insulating layer that are exposed from the holes of the mask layer are etched away to obtain the plurality of hollow portions, and the substrate body and the insulating layer covered with the mask layer are the plurality of non-hollow portions.

20. The method of claim 18, wherein a method for making the insulating substrate comprises: providing a silicon substrate comprising a first surface and a second surface opposite to the first surface, and forming a silicon dioxide layer on each of the first surface and the second surface; forming a $Si_3N_4$ layer on a surface of each of the silicon dioxide layers as a mask layer, wherein the $Si_3N_4$ layer defines some holes spaced from each other to make some portions of the silicon dioxide layer exposed; and immersing the silicon substrate with the silicon dioxide layer and the $Si_3N_4$ layer in an potassium hydroxide solution, wherein, the silicon substrate and the silicon dioxide layer that are exposed from the holes of the $Si_3N_4$ layer are etched away to obtain the plurality of hollow portions, and the silicon substrate and the silicon dioxide layer covered with the $Si_3N_4$ layer are the plurality of non-hollow portions.

* * * * *